United States Patent [19]
Clinton

[11] 4,386,317
[45] May 31, 1983

[54] APPARATUS FOR TESTING, IN-CIRCUIT, SEMICONDUCTORS SHUNTED BY A LOW RESISTANCE

[75] Inventor: James R. Clinton, Seattle, Wash.

[73] Assignee: Huntron Instruments, Inc., Lynnwood, Wash.

[21] Appl. No.: 186,494

[22] Filed: Sep. 12, 1980

[51] Int. Cl.³ .............................................. G01R 31/22
[52] U.S. Cl. ............................ 324/158 D; 324/158 T
[58] Field of Search ........... 324/158 D, 158 T, 158 R, 324/73 R, 115

[56] References Cited

U.S. PATENT DOCUMENTS

| | | | |
|---|---|---|---|
| 3,204,144 | 8/1965 | Deavenport | 324/115 |
| 3,873,918 | 3/1975 | Talbert | 324/115 |
| 3,973,198 | 8/1976 | Hunt | 324/158 D |
| 4,074,195 | 2/1978 | Hunt | 324/158 D |

*Primary Examiner*—Ernest F. Karlsen
*Attorney, Agent, or Firm*—Cole, Jensen & Puntigam

[57] ABSTRACT

A signal source in the form of a 60 Hz voltage generator provides a 12 volt peak-to-peak signal to the primary winding of a transformer which has a secondary winding with upper and lower leads and a center tap lead. The voltage between the center tap lead and each of the upper and lower leads is 6 volts when the secondary winding is not loaded. A 5 ohm resistor is connected between the upper lead and ground, while the lower lead is connected to a first test lead. The other test lead is connected to ground. In operation, the test leads are placed across the junction of the semiconductor to be tested. The junction of the lower lead and the first test lead is connected to the input of a first amplifier, the output of which is applied to one of the horizontal deflection plates of an oscilloscope. The center tap lead is connected to the input of a second amplifier which has a variable gain and is designed such that in operation the peak output of the second amplifier is a selected magnitude, regardless of the peak voltage of the input signal, sufficient to provide substantially full vertical deflection on the oscilloscope when applied to one of the vertical deflection plates.

14 Claims, 12 Drawing Figures

APPARATUS FOR TESTING, IN-CIRCUIT, SEMICONDUCTORS SHUNTED BY A LOW RESISTANCE

BACKGROUND OF THE INVENTION

This invention relates to the art of testing of semiconductors in-circuit, particularly those semiconductors which are shunted by a low resistance.

Semiconductors are now widely used in a number of different technological industries. Semiconductors include diodes, transistors, triacs, diacs, thyristors, silicon controlled rectifiers, and others. A significant amount of research is currently being done on new applications of semiconductors, and hence, it is anticipated that the use of semiconductors will expand into new areas as well as increase significantly in those areas where they are already used.

One of the most significant operational advantages of semiconductors is their long-term reliability. However, this significant advantage is decreased somewhat because semiconductors are typically very difficult to test for faults or defects, especially in-circuit. Many devices, such as curve tracers, multimeters, and beta testers have been developed to test semiconductors, but typically these devices are only effective when the semiconductor to be tested is first removed from the circuit. Even under the best of circumstances, the removal of a semiconductor is difficult and time consuming, and at worse is impossible, due to the likelihood of damage to the semiconductor by the act of removing it from the circuit.

A further difficulty with such conventional devices is that they are not capable of testing the quality of the performance of the semiconductor, i.e. they do not recognize impaired performance, due to such causes as damage or age. Such testers typically can recognize a nonfunctional semiconductor junction but the junction which is impaired, even sufficiently to seriously affect the circuit in which the semiconductor is connected, frequently will test good on the tester.

There are some testers, however, such as the ones shown and described in U.S. Pat. Nos. 3,973,198 and 4,074,195, which are owned by the assignee of the present invention, which are in fact capable of testing the operating condition of a semiconductor in-circuit. Those particular test instruments have gained increasing acceptance in the industry, but are, however, of limited use when the semiconductor being tested is shunted by a very low resistance, i.e. below 20 ohms. Also, the device disclosed in German Pat. No. 23 45 469 to Knox may in certain applications be capable of testing a semiconductor junction in-circuit, but it is significantly more limited in operational capability than the testers disclosed in the '198 and '195 patents, supra. The Knox apparatus is also not able to test semiconductors shunted by low values of resistance.

Accordingly, it is a general object of the present invention to provide an apparatus for testing the operating quality of semiconductor junctions which overcomes one or more of the disadvantages of the prior art discussed above.

It is another object of the present invention to provide such an apparatus which provides an indication of the condition of the semiconductor junction in-circuit, even when the semiconductor junction is shunted by a low resistance.

It is a further object of the present invention to provide such an apparatus which may be used in testing a wide variety of semiconductors.

It is yet another object of the present invention to provide such an apparatus which provides a readily interpretable visual indication of the condition of the junction being tested.

It is a still further object of the present invention to provide such an apparatus which is capable of providing an accurate indication of the condition of an impaired junction.

SUMMARY OF THE INVENTION

Accordingly, the present invention is an apparatus for testing, in-circuit, semiconductor junctions shunted by a low resistance which includes an impedance means having first, second and third leads connected thereto and extending therefrom, with the third lead between the first and second leads. A ground means, which includes a resistance, is connected to the second lead. First and second test lead means are provided which are suitable for being placed across a junction of the semiconductor to be tested, with one test lead means being connected to the first lead of the impedance means, the other test lead means being connected to the ground means. The apparatus further includes means for inducing an AC signal into the impedance means so that in operation, an AC test signal is produced on the first lead, which results in a current flow in the circuit comprising the first impedance means, the first and second test lead means and said ground means when the test lead means are placed across the junction. The apparatus further includes visual indicator means and first and second amplifier means. The visual indicator means has vertical and horizontal deflection plates, such as an oscilloscope. The input of the first amplifier means is connected to the first lead of the impedance means and its output is connected to one of the horizontal deflection plates of the visual indicator means. The input of the second amplifier means is connected to the third lead of the impedance means and the output of the second amplifier means is connected to one of the vertical deflection plates of the visual indicator means. The second amplifier means includes means for maintaining the peak output voltage of the second amplifier means at a particular magnitude, regardless of the peak voltage of the input signal to the second amplifier. This particular magnitude is sufficient to provide substantially full vertical deflection on the visual indicator means.

DESCRIPTION OF THE DRAWINGS

A more thorough understanding of the invention may be obtained by a study of the following detailed description taken in connection with the accompanying drawings in which.

DESCRIPTION OF THE PREFERRED EMBODIMENT

Figure 1:
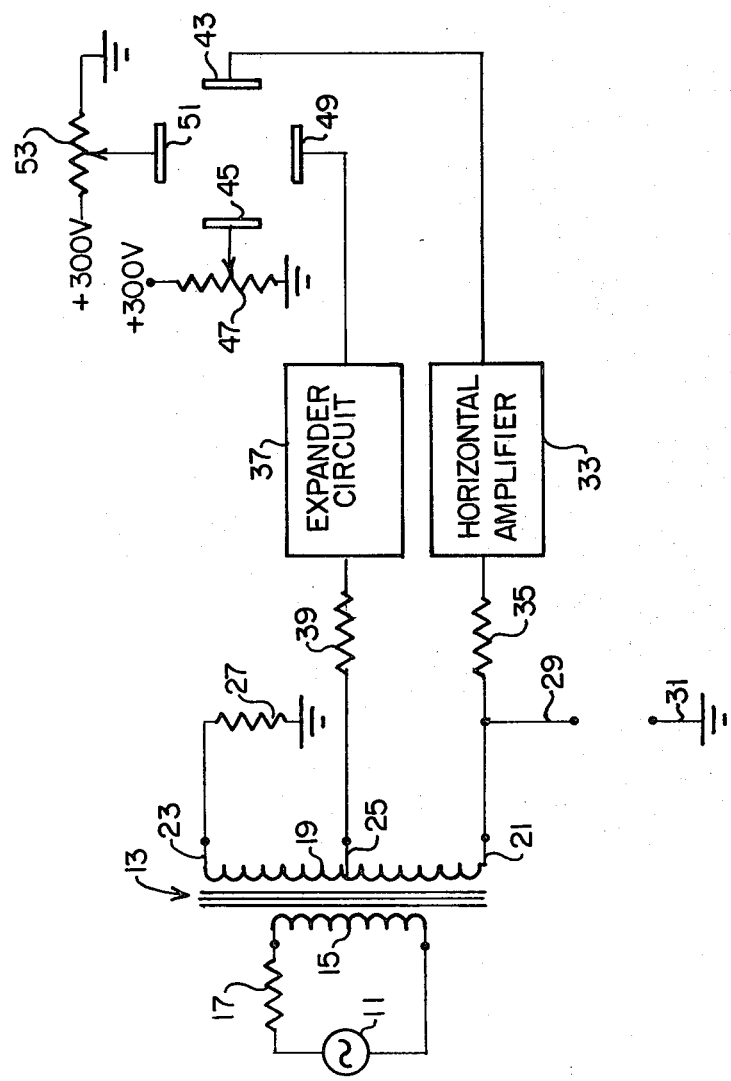
FIG. 1 is a block diagram of the present invention.

The present invention is shown in block diagram form in FIG. 1. A voltage generator 11 produces a signal with a frequency of 60 Hz and an amplitude of 12 volts peak-to-peak in the embodiment shown. The voltage generator 11 has an internal impedance of less than 1 ohm, and delivers up to 500 milliamperes of peak current at its voltage rating. A voltage generator with such specifications is commercially available from several manufactures. It should be understood, however, that the above specifications are somewhat arbitrary, and may vary from embodiment to embodiment.

The signal from voltage generator 11 is applied to a transformer 13. Transformer 13 has a primary winding 15 with 140 turns. A limiting resistor 17 has a value of 6.8 ohms, which insures that the maximum flux created in the transformer is restricted to a level which is approximately 50% of the saturation point for the particular core material and core size used in transformer 13. This results in a linear transformation of the signal in primary winding 15 to the transformer's secondary winding 19. The secondary winding 19 has a bottom lead 21 and a top lead 23 which are connected to the respective lower and upper ends of the secondary winding 19, and a tap lead 25 which in the embodiment shown is connected to the center of secondary winding 19.

There are 70 turns in the secondary winding 19 between bottom lead 21 and center tap lead 25, and an additional 70 turns between center tap lead 25 an top lead 23. When the secondary winding is open (no load), the voltage between center tap lead 25 and each of the respective top and bottom leads 23 and 21 is equal to 6 volts, so that the voltage across the entire secondary, i.e. between top and bottom leads 23 and 21, is 12 volts, the peak-to-peak voltage of the signal from voltage generator 11. The two subwindings comprising the secondary winding in the embodiment shown thus are balanced about center tap lead 25. However, this is not necessary to the proper operation of the invention, as the center tap lead may be connected at a point along the secondary winding which results in the unbalancing of the two subwindings, provided that the turns ratio of the transformer and the various voltages on the transformer are adjusted accordingly.

Top lead 23 is connected through a low value resistance 27 to ground. In the embodiment shown, resistance 27 has a value of 5 ohms, although that value could vary somewhat, depending upon the particular embodiment. It is important, however, that the value of resistance 27 be kept quite low for proper operation of the apparatus in testing semiconductor junctions shunted by a low resistance. The bottom lead 21 is connected to a first test lead 29. A second test lead 31 is connected to ground, so that a complete circuit is formed by resistance 27, top lead 23, secondary winding 19, bottom lead 21, first and second test leads 29 and 31, and ground.

The test leads 29 and 31, which may be conventional leads used commonly with electronic test instruments, are in operation placed directly across the particular semiconductor junction, or junctions in series, to be tested. Leads 29 and 31 may be placed across the junction while the semiconductor remains in-circuit, without the need to disconnect the semiconductor or any shunting elements. Frequently, the opposite sides of a given junction to be tested will be readily accessible on the circuit board to which it is secured, and the test leads may be applied directly to these external circuit points. Since test lead 31 is connected to ground, one side of the junction is always referenced to ground, while the signal present on bottom lead 21 of secondary winding 19, referred to as the test signal, is applied to the other side of the junction. In operation, it does not matter which side of the junction is connected to a particular test lead. The resulting display is reversed, but the information contained in the display is not decreased.

The bottom lead 21 of secondary winding 19 is also connected to a horizontal amplifier 33 through an input resistance 35 of 100 Kohms. Input resistance 35 provides electrical isolation between horizontal amplifier 33 and transformer 13, so that when there is no load connected between the test leads, there will effectively be no load on the transformer. The horizontal amplifier 33 is conventional, and has a gain of 12.5 in the embodiment shown. The DC reference level at the input of horizontal amplifier 33 is zero, while the DC reference level of the output signal is approximately 150 volts. Thus, a symmetrical input signal to horizontal amplifier 33 will be centered on zero volts, while the corresponding output signal will be centered on 150 volts. The output signal from horizontal amplifier 33 is in phase with the input signal.

Connected to center tap lead 25 is a vertical amplifier with a variable gain, referred to as an expander circuit 37. At the input to expander 37 is an input resistance 39, which in the embodiment shown in 50 Kohms, for the purpose of electrical isolation between expander 37 and transformer 13. The DC reference for the input signal to the expander 37 is zero volts, while the DC reference for the output signal is 150 volts, similar to that for horizontal amplifier 33. The output signal from the expander circuit, however, is 180° out-of-phase, or inverted, relative to the input signal.

The output signals from horizontal amplifier 33 and expander circuit 37, respectively, are applied to a visual indicator device 41, such as a conventional oscilloscope. In the embodiment of FIG. 1, the output signal from the horizontal amplifier 33 is applied to the right hand deflection plate 43 of the horizontal deflection circuit of oscilloscope 41. The voltage on the left hand deflection plate 45 is adjusted by means of a variable resistance 47 connected between a source of voltage and ground, such that the oscilloscope trace is horizontally centered when the signal on the right hand deflection plate 43 is at the DC reference voltage of 150 volts.

For the particular oscilloscope in the embodiment shown, the horizontal deflection sensitivity is 25 volts per centimeter and full horizontal screen deflection is 6 centimeters. The horizontal amplifier gain of 12.5 results in an output signal of 150 volts peak-to-peak, from 75 V to 225 V, for a 12 volt peak-to-peak input which results in a total horizontal deflection of the trace of 6 centimeters.

The output from expander circuit 37 is applied to the lower deflection plate 49 of the vertical deflection circuit. The voltage on the upper deflection plate 51 is adjusted by means of variable resistance 53 connected between a source of voltage and ground, such that the oscilloscope trace is vertically centered when the signal to the lower deflection plate is at the DC reference level of 150 volts. In the embodiment shown, the vertical deflection sensitivity is 17 volts per centimeter and full deflection is 4 centimeters. The gain of the expander circuit 37 is made variable such that the vertical deflection of the trace always reaches the maximum at the highest peak voltage of the input signal. This is a very significant aspect of the present invention, as it results in a visual trace on the oscilloscope in which the peak of the vertical signal always produces a full deflection while the horizontal signal is amplified by a fixed amount, and thus produces a variable deflection. This results, as explained in detail in following paragraphs, in an amplification of the information in the trace, referred to as electronic magnification, from which an indication as to the operating quality of the junction being tested can be ascertained.

When there is an open between test leads 29 and 31, i.e. when the test leads are not connected across a junction, or the junction being tested is open, the 12 volt peak-to-peak, 60 Hz signal supplied to the primary winding of the transformer 13 by the voltage generator 11 is transformed into a 12 volt 60 Hz signal on bottom lead 21, which is applied to the input of horizontal amplifier 33, and a 6 volt peak-to-peak, 60 Hz signal on center tap lead 25, which is applied to the input of expander circuit 37. The expander circuit, as previously explained, has a variable gain feature which sets the gain for a particular input signal such that the highest peak value of the input signal is amplified sufficiently such that the resulting peak of the output signal produces a maximum vertical deflection on the oscilloscope screen. Thus, in the embodiment shown, the highest peak output, either positive or negative, of the expander will be + or −34 volts about a DC reference level of 150 volts, which results in substantially full vertical deflection of the trace, regardless of the amplitude of the peak voltage of the input signal. The output signal further will be reversed in phase, as explained above, so that the negative half cycle of the output signal will correspond to the positive half cycle of the input signal and vice versa. For an open circuit condition, the signal at the input to the expander is ±3 volts about a DC reference of 150 volts and hence, the output signal is ±34 volts about a reference of 150 volts.

The signal at the vertical input to the oscilloscope will thus be a 60 Hz signal about a 150 volt DC reference, alternating between a positive peak of 184 volts and a negative peak of 116 volts, 180° out of phase with the input signal. The signal applied to the horizontal plates of the oscilloscope will be in phase with the 60 Hz input signal, and will swing between a 225 volt positive peak and a 75 volt negative peak. The above signals applied respectively, to the vertical and horizontal plates of the oscilloscope, results in a diagonal trace, slanting upwardly from left to right on the screen of the scope, through the center thereof.

The junction of a semiconductor operates like a diode in that the junction will conduct when forward biased, but will not conduct when back biased. Hence, it will conduct for one half cycle of an alternating voltage signal applied to it, assuming that the signal is referenced about zero volts. In operation of a semiconductor junction, the depletion region in the junction will start to narrow at the instant that forward current starts to flow, in response to a forward bias condition, and will narrow slightly more as the applied voltage increases, until maximum current is flowing. As the applied voltage then starts to decrease, the depletion region will widen slightly, as the forward current starts to decrease due to the decrease in applied voltage, and will continue to widen until the applied voltage is insufficient to overcome the forward resistance of the diode. Forward current then ceases. At the point that the applied alternating voltage signal changes phase, so that the junction is back biased, the widening of the depletion region increases rapidly, so that back current flow is prevented until the point where the signal voltage reaches the reverse avalanche breakdown level.

In a high quality junction, there will be a very abrupt change in the width of the depletion region at the point where the voltage across the junction changes from one-half cycle to the other, crossing the reference line. The apparatus of FIG. 1 operates by applying an alternating current test signal across the junction to be tested, thereby forcing the junction to operate in its normal in-circuit fashion, i.e. to go through the cyclical changes in its depletion region as the voltage across the junction alternates between forward bias and reverse bias conditions for the junction.

Over one half cycle of the test signal, the particular half cycle depending upon the orientation of the junction relative to the test leads, there will be no current through the junction and hence virtually no current flowing in secondary winding 19, when a high quality junction is connected between the test leads. The resulting trace on the oscilloscope for this half cycle of the test signal will thus be substantially identical to the trace resulting from the open circuit condition explained above. In a particular case, when the cathode of the junction is connected to test lead 29, and test lead 31 is connected to ground, the portion of the trace in quandrant 1 of the screen, for the positive half cycle of the test signal, will be a diagonal line extending from the center of the oscilloscope upwardly to the right.

Over the other half cycle of the test signal, however, the junction will conduct, thus changing dramatically the voltage present at bottom lead 21, which is applied to horizontal amplifier 33. A small voltage level is necessary to overcome the forward resistance of the junction, but after this level is reached by the test signal, which typically might be −0.8 volts, the junction conducts. The voltage at bottom lead 21 is thus clamped to the conduction voltage, i.e. −0.8 volts, and the voltages at center tap lead 25 and the top lead 23 start to rise, referenced against the clamped voltage on bottom lead 21. The voltage on bottom lead 21 thus stays constant at the conduction voltage level over the negative half cycle of the test signal. This constant negative voltage is applied to the input of the horizontal amplifier 33, while the increasing voltage signal on center tap lead 25 is applied to the expander 27. The result of these two signals is a vertical trace on the screen over the negative half-cycle of the test signal. The vertical trace is joined at its lower end to the left end of the diagonal trace.

Thus, there are two portions to the complete visual trace provided on the oscilloscope 41 by the circuit shown in FIG. 1. There is one portion, typically diagonal, which is the result of the junction being backed biased and not conducting, so that there is no change in voltage at the vertical input to the scope, and a second portion, typically vertical, which is the result of the junction being forward biased, so that the voltage at the horizontal input to the scope is clamped at a small value. These two portions form a trace with a sharp knee where they meet. The configuration of the trace, particularly in the vicinity of the knee area, provides information about the operational quality of the junction, which can be accurately interpreted by an operator. The use of the expander 27, as well as the low value of resistance 27, results in an amplification or electronic magnification of the vertical portion of the trace, thus in effect amplifying the information present in the trace, which is otherwise obscured when the junction is shunted by a low resistance, as shown more in detail hereinafter.

Figure 3:
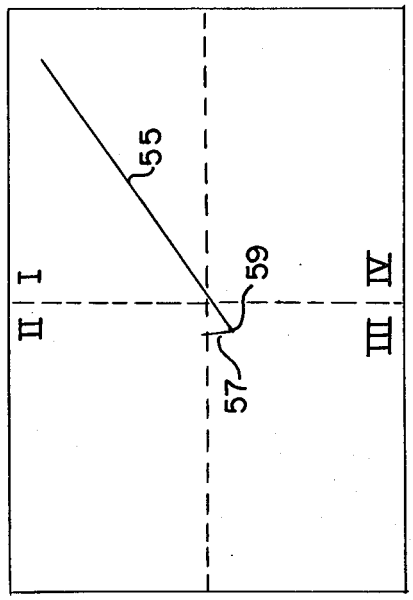
FIG. 3 is a diagram of an oscilloscope trace produced by the apparatus of the present invention when it is testing a high quality semiconductor junction.

Several specific examples of oscilloscope traces for varying junction conditions and shunts are shown in FIGS. 3–9. FIG. 3 shows the trace resulting when the circuit of FIG. 1, without the expander, is used to test a high quality junction. The diagonal portion of the trace 55 extends through quadrant I and down slightly into quadrant III, with the amount of horizontal deflection of the trace into quadrant III being equal to the level of negative voltage required to overcome the forward resistance of the junction, i.e. the voltage sufficient to initiate forward conduction of the diode.

The vertical portion 57 is the portion of the negative half cycle of the test signal over which the diode conducts, and extends from quadrant III up into quadrant II. As seen in FIG. 3, a high quality junction, without a shunt, results in a very sharp knee portion 59. Those junctions which are impaired in quality or have other substantial problems will result in particular irregularities in the knee portion of the trace.

As might be recognized from the above description, a completely shorted junction results in a straight vertical trace over both half cycles of the test signal, while a completely open junction, as described above, would cause a straight diagonal trace over both half cycles of the test signal. Hence, a shorted or open junction are easy to discern from the oscilloscope trace.

Figure 4:
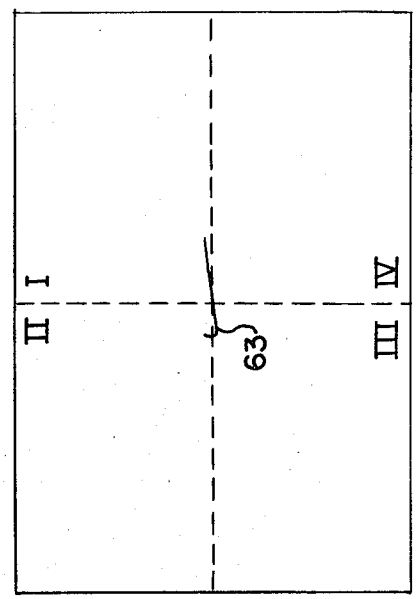
FIG. 4 is a diagram of an oscilloscope trace produced by the apparatus of the present invention, without the expander circuit, when it is testing a poor quality semiconductor junction.
Figure 5:
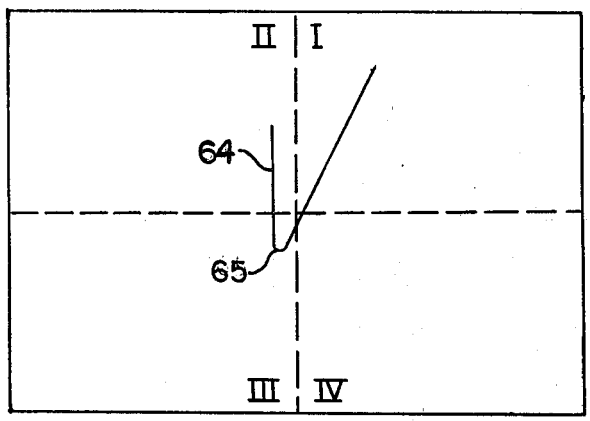
FIG. 5 is a diagram of an oscilloscope trace produced by the apparatus of the present invention, with the expander circuit, when it is testing the semiconductor of FIG. 4.

FIGS. 4 and 5 demonstrate what the trace looks like, particularly in the knee portion, when a junction being tested is leaky and shunted by a very low resistance, e.g. 10 ohms. A leaky junction impairs the operating quality of the junction but does not render it inoperable. Such a condition is typically very difficult to discover with a conventional test apparatus. FIG. 5 shows the trace produced by the circuit of FIG. 1 with the expander and FIG. 4 shows the trace without the expander. FIGS. 4 and 5, as well as subsequent figures, thus demonstrate the operability and utility of the present invention in testing semiconductor junctions which are shunted by a low resistance.

A leaky junction results in the knee area of the trace being rounded, instead of sharp, which is the case for a high quality junction. The trace provided when the expander 27 is not in the circuit is shown in FIG. 4, and is clearly much more difficult to interpret because the knee area of the trace is compressed to a relatively small portion of the overall trace and the rounding of the trace is difficult to see.

However, referring to FIG. 5, with expander 27 in the circuit, the information in the vertical portion 64 of the trace is expanded considerably. Note that in FIG. 5, the knee area 65 of the trace has been expanded considerably relative to the comparable knee area 63 in FIG. 4, such that the rounded configuration of the trace in the knee area is clearly shown, which is a reliable and easily interpretable indication that the junction being tested is leaky.

Figure 6:
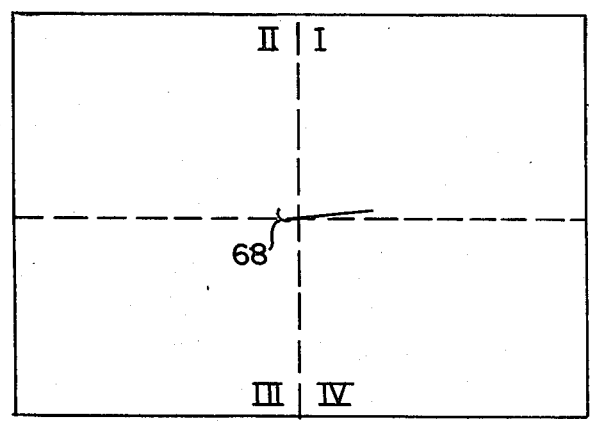
FIG. 6 is a diagram of an oscilloscope trace produced by the apparatus of the present invention, without the expander circuit, when it is testing a semiconductor junction having hysteresis problems, such as might be caused by a fractured junction.
Figure 7:
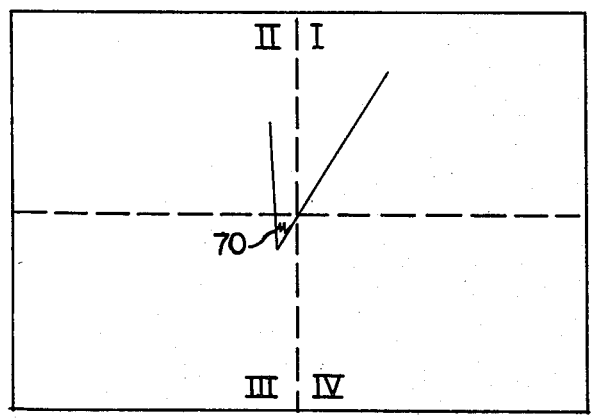
FIG. 7 is a diagram of an oscilloscope trace produced by the apparatus of the present invention, with the expander circuit, when it is testing the semiconductor junction of FIG. 6.

The traces shown in FIGS. 6 and 7, respectively, are for a junction having a hysteresis condition, in which the amplitude of the current through the junction at a given voltage when the current is increasing is different than the amplitude of current at the same voltage when the current is decreasing. FIG. 6 shows the trace for such a junction without the expander, with the knee area 68 compressed and hence difficult to interpret, while the trace in FIG. 7, being expanded in the knee area 70, clearly shows the irregularity which is caused by a hysteresis condition, e.g. a jagged trace.

Figure 8:
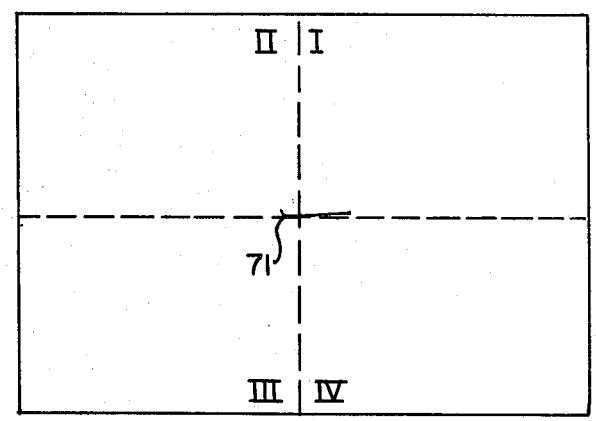
FIG. 8 is a diagram of an oscilloscope trace produced by the apparatus of the present invention, without the expander circuit, when it is testing a high quality semiconductor junction shunted by 5.3 ohms.
Figure 9:
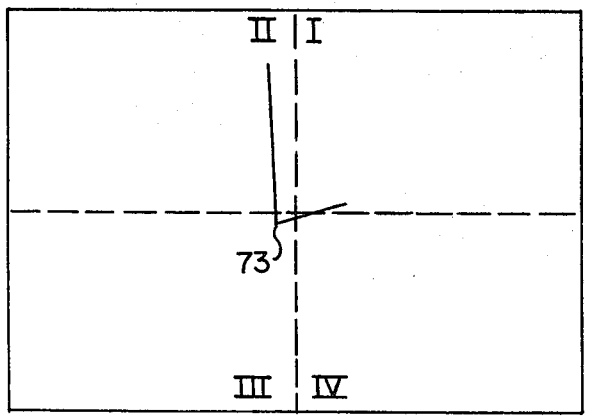
FIG. 9 is a diagram of an oscilloscope trace produced by the apparatus of the present invention, with the expander circuit, when it is testing the semiconductor junction of FIG. 8.

Other abnormal operating conditions of the junction, resulting in impaired performance cause corresponding irregularities in the trace, particularly in the knee area. With the use of the expander circuit, these irregularities can be readily identified by an operator, even when the junction being tested is shunted by a low resistance. This is demonstrated also by FIGS. 8 and 9. The trace in FIG. 8 is for a high quality junction shunted by 5.3 ohms. The trace is quite compressed, particularly in the knee area 71 and the sharpness of the knee is not readily apparent. However, with the expander circuit, the trace, as shown in FIG. 9, amplifies the knee area 73 to clearly show the sharp joint, thus providing a clear indication that the junction is high quality.

Hence, the expander circuit 27, by magnifying only the vertical portion of the trace, as opposed to magnifying both portions or just the diagonal portion, provides a significant expansion of the information in the trace, particularly in the knee area. This provides the highly advantageous result of permitting accurate in-circuit testing of semiconductor junctions which are shunted by very low resistance.

The expander accomplishes this result by using a variable gain. In each test condition, i.e., for each junction being tested, referred to as a test event, the gain is adjusted so that the highest peak, either positive or negative, of the signal on the center tap lead, when amplified, results in a maximum vertical deflection on the scope, which in the embodiment shown is 4 centimeters. The highest peak voltage of the signal at the vertical deflection plates, again in the embodiment shown is either plus or minus 34 volts relative to the DC reference voltage of 150 volts. These characteristics will, of course, vary, depending upon the particular equipment used.

Figure 10:
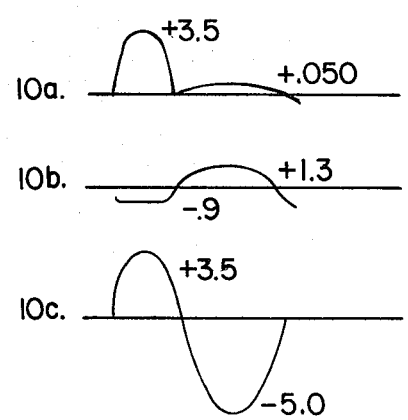
FIGS. 10a, 10b and 10c are waveforms present, respectively, at various points in the circuit of the present invention when a semiconductor junction of high quality with 5.3 ohms in shunt is being tested.

FIG. 10 shows the waveforms present at various circuit points in the testing of a high quality junction shunted by 5.3 ohms. FIG. 10c shows the waveform present in the primary winding when the high quality junction shunted by 5.3 ohms is connected between test leads 29 and 31. FIG. 10b shows the waveform present on bottom lead 21, which is referred to as the test signal. During conduction of the junction, i.e. during the positive half cycle of the waveform of FIG. 10b, the waveform on the bottom lead 21 will be clamped to a −0.9 volts, which is the voltage necessary to overcome the forward resistance of the junction. When the junction is back biased, during the negative half cycle of the signal in the primary winding, the peak voltage of the signal on the bottom lead is +1.3 volts, which is the voltage dropped across the 5.3 ohm shunting resistance.

FIG. 10a is the waveform on the center tap lead of the secondary winding. During the positive half cycle of the signal in the primary, when the junction is conducting, the voltage on the center tap lead will follow the primary signal. However, on the negative half cycle of the primary signal, during which time the junction is not conducting, there will only be a very small voltage present on center tap lead 25 because the center tap lead is balanced with respect to the top and bottom leads of the transformer, and because resistance 27 is only slightly less than the value of the shunting resistance to ground. The slight difference in value between the shunting resistance and resistance 27 is responsible for the small voltage which is present.

The inventor has discovered that the most information is obtained from a trace when the two portions of the trace meet at an acute angle. This condition exists when the value of resistance 27 is less than the value of the shunting resistance. As can be seen, for instance, from FIGS. 8 and 9, when the value of the resistance 27 is only slightly less than the value of the shunting resistance, the diagonal portion of the trace is nearly horizontal. If the resistance 27 is larger than the shunting resistance, the angle between the two portions of the trace becomes obtuse, with the diagonal portion of the trace sloping downwardly from left to right, and the irregularities in the knee area caused by a poor junction are less prevalent. Thus, it is desirable, although not absolutely necessary, that resistance 27 be less than the minimum shunt resistance expected.

In the embodiment shown, resistance 27 is set at 5 ohms, and the position of center tap lead 25 and the various secondary voltages are selected in accordance with that particular value of resistance. Five ohms was selected for the embodiment shown because it is relatively unusual to find shunting resistances in actual circuits which are less than 5 ohms. However, it should be understood that even with a resistance 27 of 5 ohms, semiconductors shunted by less than 5 ohms can in most cases still be successfully tested. Furthermore, if necessary, the circuit itself can be changed slightly within the spirit of the present invention so that the two portions of the trace meet at an acute angle in such a circumstance. This typically would require decreasing the value of resistance 27 as well as adjusting some of the other circuit values.

Figure 2:
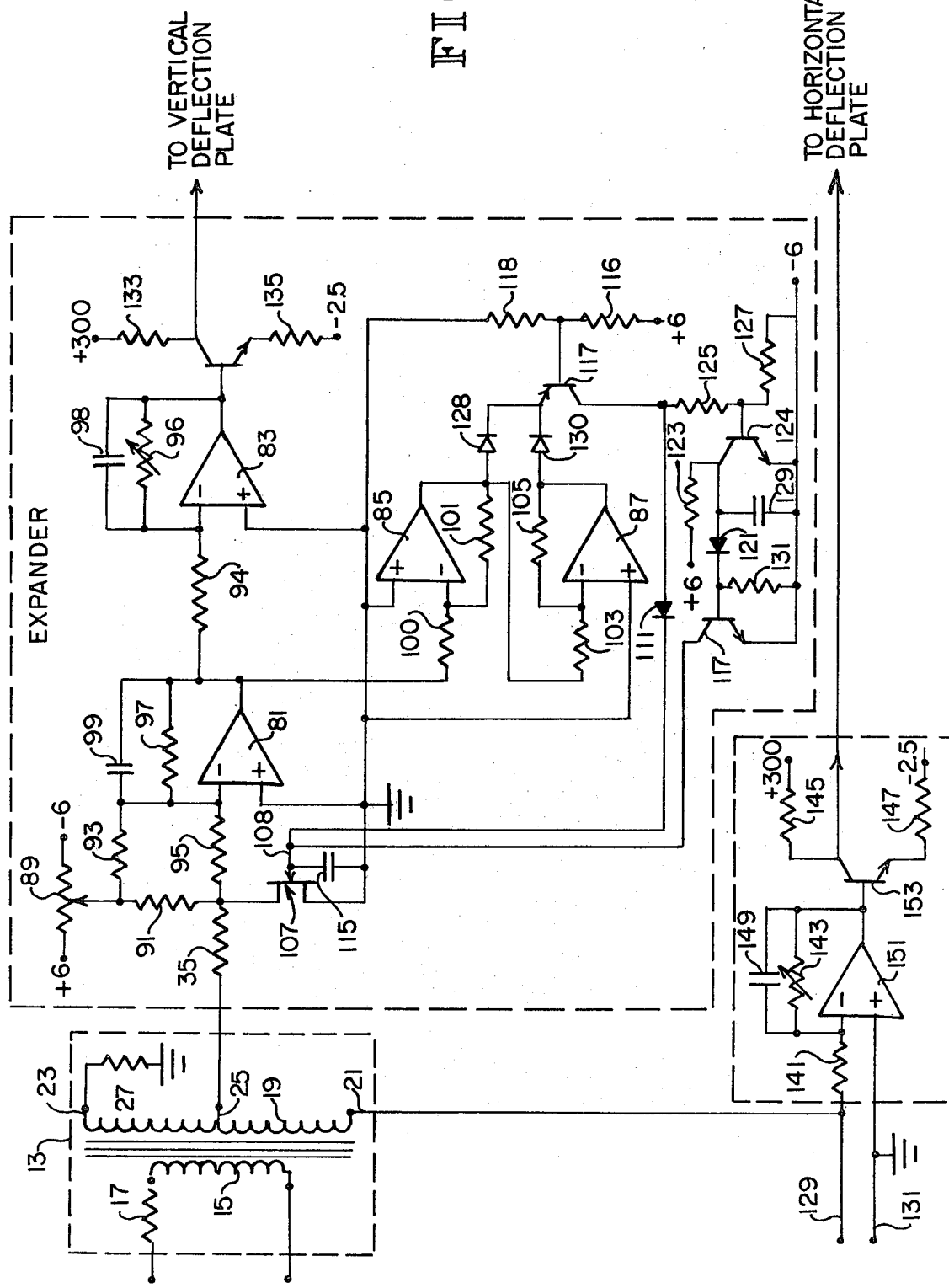
FIG. 2 is a schematic diagram of the invention shown in block diagram form in FIG. 1.

The schematic diagram of the circuit which is shown in block diagram form in FIG. 1 is shown in FIG. 2. In particular, the detailed circuit arrangement for expander 37 and horizontal amplifier 33 is shown. The expander circuit referred to generally at 27 is basically an audio amplifier with automatic gain circuitry. As explained above, the output signal from the expander circuit, which is applied to the lower vertical deflection plate of the oscilloscope, is inverted relative to the input signal. The input signal is referenced with respect to ground, and the output signal is referenced to a specified DC output level that remains constant for a zero voltage input. In the embodiment shown, the DC reference voltage of the expander is adjusted to +150 volts. For each test event, the highest peak value of the input signal, whether that peak be negative or positive, is recognized by the expander circuitry, and the gain of the expander then adjusted so that the highest peak of the input signal is amplified to the desired output signal level, with the remainder of the input signal being amplified accordingly.

The expander circuit shown operates on a cycle by cycle basis, i.e., the automatic gain feature completes its gain adjustment within one cycle after the test event is initiated. This fast response, while not necessary to the operation of the invention, is highly desirable, since it prevents any undesirable flutter movement in the initial display of the trace, which would be disturbing to the viewer. For a 60 Hz input signal, the automatic gain adjustment in the circuit shown is completed within 25 milliseconds. The inventors have discovered that the circuit shown has very good operating characteristics. The change in output voltage is less than 0.3 db over a dynamic input level change of 50 db, and the total harmonic distortion is less than 1% over the entire dynamic range.

In detail, the expander circuit 27 includes four operational amplifiers 81, 83, 85 and 87. Operational amplifiers 81 and 83 are the main signal amplifiers. Operational amplifier 81, in combination with resistors 89, 91, 93, 95, 97 and capacitor 99 form a low noise amplifier having a voltage gain of approximately 14. The operational amplifier selected has a very low noise figure because of the inherent low input signal voltage level. Resistance 89, 5 Kohms, compensates for the offset input level of operational amplifier 81, while resistances 91, 1.2 Mohm, and 93, 1 Mohm, are used to balance the voltage across resistance 95, 3.3 Kohm. This offset compensation circuitry provides a small current to the input junction of resistors 95 and 35 to prevent leakage from field effect transistor 107, after being amplified, from initiating operation of the automatic gain circuitry. It also overcomes the inherent offset of the op amp 81, and the offset of other circuit elements, so that it acts generally like a system DC balance control.

Op amp 83, and resistances 94, 1 Kohm and 96, 25 Kohm, and capacitor 98, 0.001 microfarad, form the second main signal amplifier. Capacitor 98 is used to reduce the amplification of high frequency noise. The gain of this stage is approximately 25, so that the output voltage can be adjusted from zero to a maximum 2.5 volts peak-to-peak. Op amp 85, with resistor 100, 10 Kohm, and resistor 101, 68 Kohm, form the positive-going automatic gain feedback amplifier. Om amp 87, in combination with resistor 103, 10 Kohm, and resistor 105, 10 Kohm, is an inverter for the signal from op amp 87. The gain of the feedback amplifier is 68 in the embodiment shown. The combined output of amplifiers 85 and 87, through diodes 128 and 130, will be always positive or negative. The polarity of the output signal from this amplifier is determined by the polarity of the maximum peak of the input signal. The output of the amplifier controls the operation of transistor 117, which in turn controls the operation of the automatic gain circuit, as explained in more detail hereinafter.

The amplitude of the signal into operational amplifier 81 is controlled by field effect transistor 107. Input resistance 35, 50 Kohm, and the drain-source resistance of field-effect transistor 107 in effect form a voltage divider whose output voltage is dependent upon the DC voltage level at the gate of field-effect transistor 107. The bar resistance of the field-effect transistor 107 is linear only over a very small range of drain-to-source voltage so that the maximum peak-to-peak voltage on the drain connection of transistor 107 is held to less than 7 millivolts.

When there is no signal at the input to the expander circuit 27, the circuit is in a quiescent condition. When the expander is in its quiescent condition, field-effect transistor 107 must be biased so that it is completely off. This assures that op amp 81 can accept low level input signals, below its threshold level, without the automatic gain action of the expander circuit being initiated, which would further reduce those low level input signals. For field-effect transistor 107 to be biased completely off, so that its drain-source bar resistance is maximum, a sufficient bias must be maintained on its gate 108. This occurs in the embodiment shown at −6 volts, due to capacitor 115 being fully charged from the −6 volt supply line through the collector-emitter circuit of transistor 119. The −6 volts on gate 108 of field-effect 107 is sufficient to cause it to be fully turned off. Transistor 119 is biased into saturation because of the +6 volts on its base from the −6 volt supply through resistor 123 and diode 121. The drain-source bar resistance of transistor 107 when it is biased off is typically in excess of 1 megohm.

Diode 111 is back biased and therefore not conducting from the −6 volt supply through resistors 125 and 127. Diode 121 is a multi-junction diode and has a forward voltage drop of approximately 3.5 volts. This results in a voltage at the collector of transistor 124 of approximately −1.85 volts. Since, in the expander's quiescent condition, the collector of transistor 117 is at −6 volts and the transistor is not conducting, there is no current through resistor 125 and transistor 124 is held in an "off" condition, because its base-emitter voltage will be held close to zero volts by resistor 127. The resistors 116 and 118, acting as a voltage divider from the 6 volt supply establish a voltage of 2.7 volts at the base of transistor 117. During this time, capacitor 129 will have a charge on it of approximately 4.15 volts. This charge flows through resistor 123 until transistor 119 starts to conduct through diode 121, at which time the conventional clamping action of diode 121 prevents the charge from increasing. The final voltage at the collector of transistor 124 under quiescent conditions, as stated above, is approximately −1.85 volts.

An input signal applied to the expander circuit will cause the circuit to change from a quiescent condition to an active condition. At the initialization of active operation, over 90% of the current from the input signal flows through resistor 95 into the inverting input of op amp 81. When the output voltage of op amp 81 reaches approximately ±58 millivolts, the output of one of the op amp combinations 85 and 87 goes above the bias voltage at the base of transistor 117, and diode 128 or diode 130 begins to conduct, causing transistor 117 to turn on. This initiates operation of the gain control circuit. If the gain control circuit is not quickly effective, amplifier 81 will go quickly into saturation. The output of op amp 85 is positive when the input signal to op amp 81 is positive, and diode 128 conducts, while when the input signal to op amp 81 is negative, op amp 87 will have a positive output signal, and diode 130 will conduct.

The collector voltage of transistor 117, which is −6 volts during the quiescent condition of the expander circuit, will start to rise the instant that transistor 117 turns on, i.e. when the voltage on the emitter goes above the bias voltage on the base of the transistor. The collector voltage on transistor 117 will continue to rise with a rise in the output voltage from op amp 81, until the diode 111 starts conducting. As diode 111 begins to conduct, the charge on capacitor 115 will be reduced, through a circuit comprising diode 111, the collector-to-emitter resistance of transistor 117, diode 128 or 130, and the output resistance of amplifier 85 or 87. Consequently, the gate voltage of transistor 107 will rise and the drain-source bar resistance will decline.

At the same time, the collector current of transistor 117 flows through resistor 125 and the base-emitter circuit of transistor 124, which results in transistor 124 rapidly turning on, which in turn results in capacitor 129 discharging through the saturation resistance of transistor 124. As the voltage on the collector of transistor 124 is thus reduced, current flow through the base-emitter circuit of transistor 119 will cease, and it will be turned off by resistor 131. Consequently, the collector resistance of transistor 119 will increase, eliminating the charge path for capacitor 115.

Since the charge path for capacitor 115 is eliminated, and diode 111 is conducting, which results in a reduction of the charge on capacitor 115, the voltage on the gate of field effect transistor 107 changes to the point where the drain-source bar resistance starts to limit the incoming signal current to resistor 95. A point of equilibrium is soon reached, before the input signal moves through one cycle. At this point of equilibrium, the drain-source bar resistance of transistor 107 stops changing, the input voltage to amplifier 81 stops changing, the output voltage from op amp 85 or 87 will stop changing, the emitter and collector current of transistor 117 will stop changing, the voltage drop across resistor 125 will stop changing, and the charge on capacitor 115 will stabilize. At this point, the operation of the circuit is stabilized to a particular gain which provides the desired peak voltage, at the output of op amp 81.

Between successive pulses, when the input signal is zero, capacitor 115 will maintain the correct bias voltage on the gate of transistor 107 to maintain a constant DC output from amplifier 83. Thus, the desired DC reference output is maintained. Also, the desired gain control action is maintained from cycle to cycle by the action of resistor 123 and capacitor 129. The voltage on the collector of transistor 124 will start to rise between successive pulses, due to the time constant of resistor 123 and capacitor 129. Since the time between successive pulses at the collector of transistor 117 is 16.7 milliseconds, the charge on capacitor 129 will increase to approximately 1.8 volts, making the voltage at the collector of transistor 124 −4.2 volts. Capacitor 129 will again discharge on the next pulse, and will continue to charge and discharge as long as the input signal to the expander circuit is constant in amplitude. Diode 121 remains back biased and transistor 117 remains off, so the gain control action on field effect transistor 107 remains stable.

A loss in the signal level at the input to the expander, or a change in signal level over more than 3 cycles, will allow the collector voltage of transistor 124 to increase sufficiently to forward bias diode 121 and transistor 119, causing transistor 119 to go into saturation, which instantly charges capacitor 115 to a −6 volts, biasing transistor 107 completely off, allowing the gain of the op amp 81 to be maximum.

Resistors 133 and 135 and transistor 137 complete the expander circuitry. The emitter of transistor 137 is returned to a −2.5 volt level through resistor 135. Since the base voltage of transistor 137 is referenced to zero volts DC, the emitter voltage will be approximately 0.7 volts lower, which fixes the emitter current at 0.818 milliamps and the collector voltage at plug 150 volts. This stage has a voltage gain of 81.

The horizontal amplifier comprises resistors 141, 143, 145, 147, capacitor 149, operational amplifier 151 and transistor 153. The op amp has a maximum voltage gain of 0.2, which is variable from zero to maximum. Capacitor 149 operates as a feedback capacitor that integrates out noise. Resistors 145 and 147 and transistor 153 form the output stage which is identical to the output stage of the expander circuit. The total gain of the transistor amplifier is 16, and is variable from zero to maximum. In the embodiment shown, the gain of the horizontal amplifier circuit is set at 12.5.

Thus, the present invention, which has been described above and shown in the drawings, is an apparatus for testing the operational quality of individual junctions of semiconductors. The circuit is designed to provide a readily interpretable visual display which indicates the quality of the junction, even when the semiconductor junctions being tested are shunted in circuit by a low resistance. Important to the function of the apparatus is a portion referred to as the expander circuit, which in effect amplifies one portion of the display trace for the purpose of amplifying the information in the display.

Although a preferred embodiment of the invention has been disclosed herein for purposes of illustration, it should be understood that various changes, modifications and substitutions may be incorporated in such embodiment without departing from the spirit of the invention, as defined by the claims which follow.

What is claimed is:

1. An apparatus for testing, in circuit, a semiconductor junction shunted by a low resistance, comprising:
    a source of AC voltage;
    transformer means comprising a primary winding and a secondary winding, the secondary winding having a lower lead and an upper lead extending therefrom, and a tap lead also extending therefrom at a preselected point between the lower and upper leads;
    first resistance means connected between said upper lead and ground;
    first and second test lead means suitable for being placed across a junction of the semiconductor to be tested, one test lead means being connected to the lower lead of the secondary winding of said transformer means, the other test lead means being connected to ground;
    visual indicator means having vertical and horizontal deflection plates;
    first amplifier means connected to the lower lead of the secondary winding of said transformer means so that the signal on the lower lead is sufficiently large to produce a horizontal deflection on said visual indicator means;
    means for connecting the output of said first amplifier means to one of the horizontal deflection plates of said visual indicator means;
    second amplifier means connected to the tap lead of the secondary winding of said transformer means, said second amplifier means including means for establishing the gain of said second amplifier means so that, for each test event, the peak output of said second amplifier means has a preselected amplitude, regardless of the peak amplitude of the input signal to said second amplifier means, the preselected amplitude being sufficient to provide substantially full vertical deflection on the visual indicator means when applied to the vertical deflection plate thereof; and
    means connecting the output of said second amplifier means to one of the vertical deflection plates of the visual indicator means, the pattern produced on the screen of the visual indicator means during operation of the testing apparatus providing an accurate indication of the operational quality of the semiconductor junction being tested.

2. An apparatus of claim 1, wherein said visual indicator means is an oscilloscope.

3. An apparatus of claim 1, wherein said lower lead is connected to the bottom of said secondary winding, the upper lead is connected to the top of said secondary winding and the tap lead is at a point substantially intermediate of the lower and upper leads, and wherein the secondary of said transformer means has substantially the same number of turns as the primary winding of said transformer means.

4. An apparatus of claim 1, wherein the value of said first resistance means is substantially no greater than the value of the low resistance shunt, if any, of the junction being tested.

5. An apparatus of claim 1, wherein said source of AC voltage has a frequency of approximately 60 Hz, and wherein said primary winding includes a second resistance means for limiting the maximum flux in said transformer to a level which is substantially less than the saturation level of said transformer means.

6. An apparatus of claim 1, including means for isolating said first and second amplifier means from said transformer means such that when there is no load between said first and second test lead means, there is effectively no load on said transformer means.

7. An apparatus of claim 1, wherein said first amplifier means includes means for establishing a DC reference voltage for the output signal of said first amplifier means, and wherein the gain of said first amplifier means is fixed at such a level that a substantially full horizontal deflection of the trace on the visual indicator means occurs in response to a signal at the input of said first amplifier which is substantially equal to the peak value of the AC voltage produced by said source of AC voltage.

8. An apparatus of claim 6, wherein said second amplifier means includes means for establishing a DC reference voltage for the output signal of said second amplifier means which is substantially equal in magnitude to the DC reference voltage for said first amplifier means, and wherein the reference voltage is present at the output of said second amplifier means even when the input signal to the second amplifier means is zero.

9. An apparatus of claim 1, wherein the gain of said second amplifier means is established in less than one cycle of the input signal applied to said second amplifying means, so that there is substantially no flutter of the trace on the visual indicator means.

10. An apparatus of claim 1, wherein the gain of said second amplifying means is set so that the higher of the positive and negative peak voltages of the input signal applied to the second amplifier means is amplified to the preselected amplitude.

11. An apparatus for testing, in circuit, semiconductor junctions shunted by a low resistance, comprising:
impedance means having first and second leads connected thereto and a third lead connected thereto between the first and second leads;
a resistance means connected between said second lead and ground;
first and second test lead means suitable for being placed across a junction of the semiconductor to be tested, one test lead means being connected to the first lead of said impedance means, the other test lead means being connected to ground;
means for inducing an AC signal into said impedance means, so that in operation, an AC test signal is produced on said first lead, resulting in a current flow in the circuit comprising said first impedance means, said first and second test lead means and said ground means when said test lead means are placed across a junction;
a visual indicator means having vertical and horizontal deflection plates, such as an oscilloscope;
first circuit means, including first amplifier means, connected between the first lead of said impedance means and one of the horizontal deflection plates of said visual indicator means; and
second circuit means, including second amplifier means, connected between the third lead and one of the vertical deflection plates of said visual indicator means, said second amplifier means including means for maintaining the peak output voltage of the signal applied to the vertical deflection plate sufficiently high to result in substantially full vertical deflection of the trace on the visual indicator means, regardless of the peak voltage of the input signal to the second amplifier means.

12. An apparatus of claim 1, wherein said holding means includes a field effect transistor and means for biasing the field effect transistor completely off when the circuit is in its quiescent condition, so that the field effect transistor appears to be an open circuit.

13. An apparatus of claim 1, wherein said initiating means includes a transistor which is biased off at a particular voltage and second amplifier means for amplifying the output of said first amplifier means and applying the output of said second amplifier means to said transistor, the gain of said second amplifier means being such that the output signal of said second amplifier means is sufficient to turn on said transistor when the output of said first amplifier is at the predetermined level.

14. An apparatus of claim 13, wherein said second amplifier includes a first combination of an operational amplifier and a diode and a second combination of an operational amplifier and a diode connected to the output of the first operational amplifier, the output of both diodes being connected to said transistor, to insure that said feedback is initiated at the desired voltage whether the higher peak of the input signal is positive or negative.

* * * * *